United States Patent [19]

Martin

[11] 4,091,453
[45] May 23, 1978

[54] LOW OFFSET AC CORRELATOR

[75] Inventor: Gayle P. Martin, Indialantic, Fla.

[73] Assignee: The United States of America as represented by the Secretary of the Air Force, Washington, D.C.

[21] Appl. No.: 740,584

[22] Filed: Nov. 10, 1976

[51] Int. Cl.² .............................................. G06G 7/19
[52] U.S. Cl. ..................................... 364/819; 328/160
[58] Field of Search ................ 235/181, 194; 328/160; 325/474, 475, 476, 477

[56] References Cited

U.S. PATENT DOCUMENTS

| | | | |
|---|---|---|---|
| 2,608,648 | 8/1952 | Magnuski | 325/477 |
| 3,119,067 | 1/1964 | Wohlenberg et al. | 325/477 |
| 3,614,407 | 10/1971 | Fournier | 235/181 |
| 3,867,620 | 2/1975 | Coor | 235/194 |
| 4,006,353 | 2/1977 | Pierce | 235/194 |

Primary Examiner—Felix D. Gruber
Attorney, Agent, or Firm—Joseph E. Rusz; George Fine

[57] ABSTRACT

A low offset AC correlator avoids DC offset and low frequency noise by frequency operating the correlation signal so that low noise, low level AC amplification can be substituted for DC amplification. Subsequently, the high level AC signal is demodulated to a DC level.

1 Claim, 1 Drawing Figure

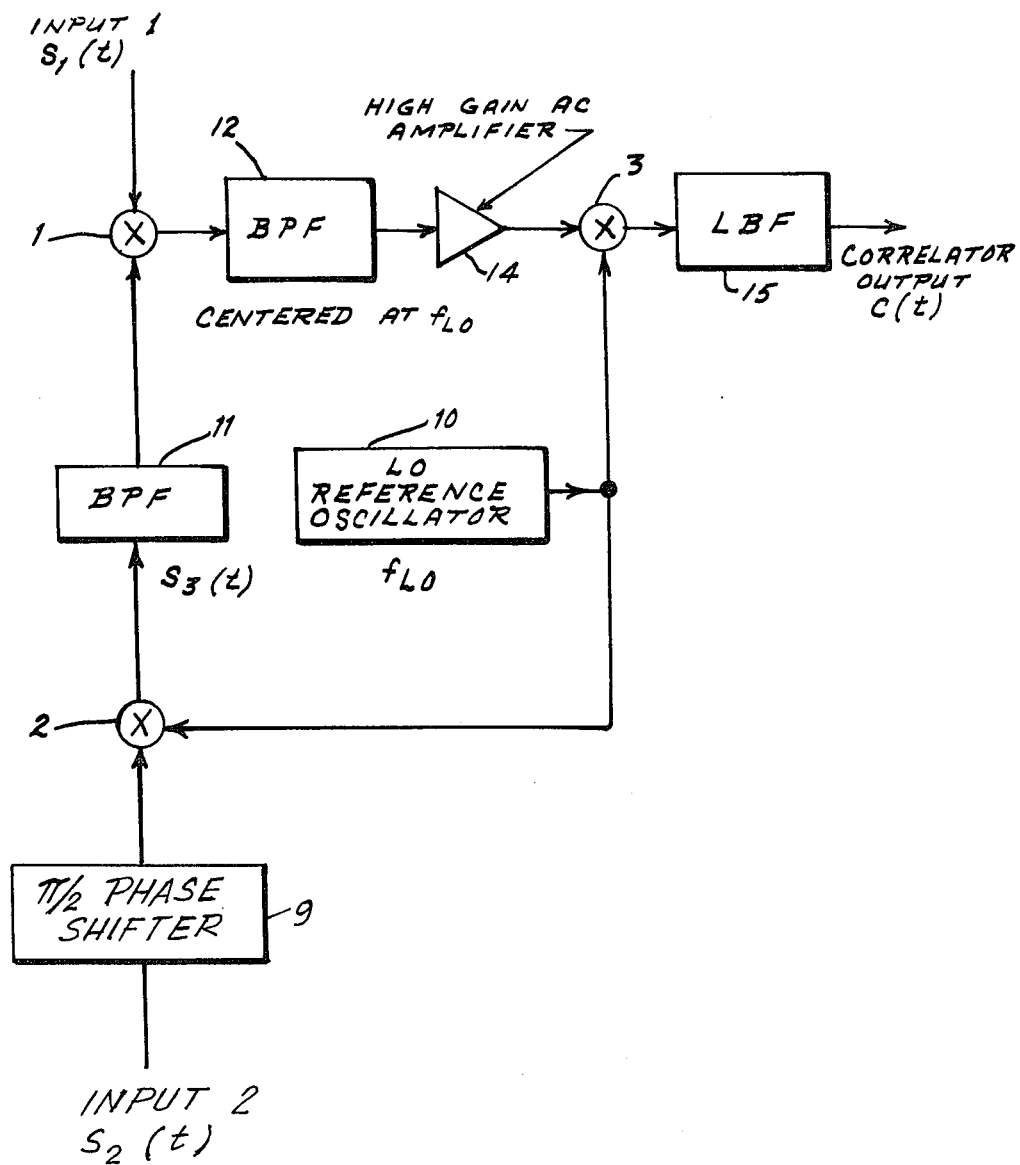

LOW OFFSET AC CORRELATOR

STATEMENT OF GOVERNMENT INTEREST

The invention described herein may be manufactured and used by or for the Government for governmental purposes without the payment of any royalty thereon.

BACKGROUND OF THE INVENTION

In adaptive array circuits, a need exists for a correlator (multiplier) with specific properties. One of the properties is essentially zero DC output whenever either of two inputs is zero or whenever the inputs are in phase quadrature. It is especially important that a zero output be obtained, when appropriate, over large dynamic ranges of either input. Another property is that one or both of the input signals be very weak even at the peak of dynamic signal variation. Under these conditions a useful high level correlation signal is desired. Very strict adherence to a perfect multiplication law is of secondary importance.

In a straightforward low offset design (referred to as "a low offset correlator design"), the basic correlator design met all of the above objectives, DC offset errors and 1/f noise in operational amplifiers following the correlator overshadowed the basic correlator performance given weak signal inputs. These effects reduced the potential usefulness of the design. In the correlator of the present invention, the DC and 1/f noise problems are alleviated, resulting in a much more sensitive and versatile design. The design allows low noise AC amplification of the correlation signals which are then synchronously demodulated at high level.

SUMMARY OF THE INVENTION

A low offset AC correlator is provided. Basically one of two signals is frequency shifted in order that the correlation product from the first mixer is a modulated carrier rather than a DC signal. Consequently, the output from the first mixer can be raised in level by a high gain AC amplifier without suffering the DC offset and low frequency noise. Then a subsequent mixer accomplishes a synchronous demodulation of the correlation signal, the result being a high level quasi DC output.

DESCRIPTION OF THE DRAWINGS

In the single FIGURE of the present invention there is shown in block diagram form a preferred embodiment of the basic low offset AC correlator.

In order to comprehend the AC correlator, a mathematical description is given in the following paragraphs.

There is represented the input signals $S_1$ and $S_2$ as a function of time with complex envelopes, that is $$S_1(t,\omega) = A_1(t)e^{(j\omega_s t + \phi_1)} \tag{1}$$

$$S_2(t,\omega) = A_2(t)e^{(j\omega_s t + \phi_2)}. \tag{2}$$

Input $S_2$ is passed through $\pi/2$ phase shifter 9 and then multiplied in mixer 2 by the constant amplitude LO signal from reference oscillator 10 at frequency $\omega_o$ giving $$S_3(t,\omega) = \frac{A_2(t)}{2}\left[e^{j(\omega_s - \omega_o)t + \phi_2} + e^{j(\omega_s + \omega_o)t + \phi_2}\right] \tag{3}$$

In principle, one may filter out and use only one of the two new frequencies, in which case extraction of in-phase and quadrature correlation products is possible with inphase and quadrature LO signals through use of two mixers where mixer 3 is presently located. In some applications, this may well be the realization of choice, however, a simpler circuit is realized when both spectral terms are retained. Retention of both terms lead to the requirement of two complete AC correlators for extraction of both in-phase and quadrature data; additionally either $S_1$ or $S_2$ must be phase shifted by $\pi/2$ radians.

The output of mixer 2 is passed through bandpass filter 11 and when $S_3$ is multiplied by $S_1$ in mixer 1 the output $S_4$ is $$S_4(t,\omega) = \frac{A_1(t)A_2(t)}{4}\left[e^{j(2\omega_s - \omega_o)t + (\phi_1 + \phi_2)} + e^{j(2\omega_s + \omega_o)t + (\phi_1 + \phi_2)} + e^{j(-\omega_o)t + \phi_2 - \phi_1} + e^{j\omega_o t + \phi_2 - \phi_1}\right] \tag{4}$$

After (4) is simplified there is obtained $$S_4(t,\omega) = \frac{A_1(t)A_2(t)}{4}\left[e^{j2\omega_s t + 2(\phi_1 + \phi_2)} + 2e^{j(\phi_2 - \phi_1)}\cos(\omega_o t)\right] \tag{5}$$

It is assumed that bandpass filter 12 (BPF) acting upon $S_4$ is centered at $\omega_o$ and that negligible amounts of the signal component at 2 are passed. Thus, after amplification in high gain AC amplifier 14 of amount G, the input due to $S_4$ at mixer 3, $S_5(t)$ is given by $$S_5(t,\omega) = \frac{G}{2} A_1(t)A_2(t)e^{j(\phi_2 - \phi_1)}\cos(\omega_o t) \tag{6}$$

It is assumed for convenience that amplifier 14 is not dispersive although such effects must be accounted for in practice. (Any phase shift at $\omega_o$ will be accounted for in the phasing of the LO input from oscillator 10 to mixer 3; dispersive phase errors at the band edge result in reduced sensitivity to signal components at band edge). Signal $S_5$ is finally demodulated at mixer 3 producing output $S_6$. It is assumed that an arbitrary LO phase, $\theta$, is present at mixer 3. There is obtained $$S_6(t,\omega) = S_5(t,\omega)e^{j\omega_o t + \theta}. \tag{7}$$

After expansion and simplification, it is found that $$S_6(t,\omega) = \frac{GA_1(t)A_2(t)}{4}e^{j(\phi_2 - \phi_1)}[\cos\theta + \cos(2\omega_o t + \theta)] \tag{8}$$

The high frequency terms are rejected by low pass filter (LPF) 15 resulting in a complex correlation product phasor at zero frequency, $C(t,0)$, given by $$C(t,\omega) = C(t,0) = \frac{GA_1(t)A_2(t)}{4}e^{j(\phi_2 - \phi_1)}\cos\theta \tag{9}$$

Now foregoing the complex envelope notation, the correlator output, $c(t)$, becomes $$c(t) = \frac{GA_1(t)A_2(t)}{4}\cos(\phi_2 - \phi_1)\cos\theta \tag{10}$$

As stated previously, a quadrature correlation signal is obtained by phase shifting either $S_1$ or $S_2$ by $\pi/2$ radians. If $\phi_1$ is replaced in (10) with $(\phi_1+\pi/2)$, the effect of such a phase shift, there is obtained $$c(t) = \frac{-GA_1(t)A_2(t)}{4} \sin(\phi_2-\phi_1)\cos\theta \quad (11)$$

Clearly, for a maximum correlation signal $\theta = 0$ is required. It is also clear that $\theta \pm \pi/2$ does not result in the quadrature correlation signal but instead results in zero output. Conversely, phase shift errors in the AC amplifier and BPF result only in reduced output and not in incorrect output.

It was previously noted that a $\pi/2$ phase shift at the input frequency could be exchanged for filtering at $(\omega_s-\omega_o)$ or $(\omega_s+\omega_o)$ and extracting in-phase and quadrature outputs with in-phase and quadrature LO inputs to a pair of third mixers. This is demonstrated by arbitrarily selecting the higher harmonic in (3) for application in the second (correlator) mixer. For the AC correlation output, there is obtained $$S_4(t,\omega) = \frac{A_1(t)A_2(t)}{4}\left[e^{j(\omega_o t+\phi_2-\phi_1)}+e^{j(2\omega_s+\omega_o)t+\phi_2-\phi_1}\right] \quad (12)$$

Using a procedure similar to that used previously, there is found the input to mixer 3. Thus $$S_5(t,\omega) = \frac{GA_1(t)A_2(t)}{4}\left[e^{j\omega_o t+\phi_2-\phi_1}\right] \quad (13)$$

Consider mixing $S_5$ with a LO signal $e^{j\omega_o t+\theta}$ where $\theta$ is arbitrary. We get $$S_6(t,\omega) = \frac{GA_1(t)A_2(t)}{8}\left[e^{j2\omega_o t+\phi_2-\phi_1+\theta}+e^{j(\phi_2-\phi_1-\theta)}\right] \quad (14)$$

After low pass filtering, and again foregoing the complex notation, it is found that $$c(t) = \frac{GA_1(t)A_2(t)}{8}\cos(\phi_2-\phi_1-\theta) \quad (15)$$

If $\theta = 0$, the in-phase correlation is obtained while $\theta = \pi/2$ yields the quadrature correlation. In contrast to the previous circuit, phase shift errors in the AC amplifier, band pass filter, or in the LO lines lead to a correlation error rather than simply a reduced output.

Circuits supplying $S_1(t)$ and $S_2(t)$ to the correlator should have bandwidths compatible with the bandwidth required for $A_1(t)$ and $A_2(t)$ in addition to that required for the rate of change of $\theta_1$ and $\theta_2$. It is noted that this second contribution is usually small compared to the first. (It is worth noting that in some applications, part of the energy in the spectrum of $A_1$ and $A_2$ can be sacrificed as long as that retained carries the $d\theta_1/dt$ and $d\theta_2/dt$ information at a power level sufficiently above thermal noise).

Since the correlation operation at mixer 2 is reminiscent of a conventional despreading multiplication, the correlation product $A_1(t)A_2(t)$ is almost always very slowly varying; almost all of the bandwidth needs are that of $d\theta_1/dt$ and $d\theta_2/dt$. If the first correlation technique described has an upper and lower correlation sideband, then the BPF must pass twice the $d\theta/dt$ bandwidth; only half this width is required for the second technique. In most present adaptive applications a 10 KHz bandwidth for $d\theta/dt$ is adequate.

Given the conditions just described and using the first correlation technique described, a 20 KHz BPF and an AC amplifier center frequency (and LO frequency) of roughly 10 KHz is selected. Here the advantage of an inexpensive, high gain, low frequency amplifier can be seen.

The output of mixer 2 will have a correlation signal to noise output dependent upon the inputs. We have $$\frac{C}{N} = (\text{const.})\frac{B_s}{B_c}\frac{R_1R_2}{1+R_1+R_2} \quad (16)$$

where $R_i = S_i/N$ at mixer 2 and N is assumed equal for both inputs (different N changes the constant in 16). The term $B_s$ is the signal bandwidth and $B_c$ is the correlation bandwidth due to $d\theta/dt$. Generally, $B_s$ and $B_c$ are fixed, $R_i$ is known and a C/N for proper system operation is desired. In this case, $R_2$ (or $R_1$) can be allowed to deteriorate (possibly through non-use of RF amplifiers in the adaptive circuitry) as long as an adequate C/N is obtained. Mixer 2 introduces loss as well as noise. Its effect as well as that of the BPF filter loss and of the AC amplifier are taken into account using conventional receiver noise figure calculations.

The correlation mixer (mixer 2) must be of a type which does not display a threshold effect such as seen with diode mixers. Otherwise at least one of the inputs $S_1$ or $S_2$ would have to be high level. Offset is not important since DC terms will be rejected by the AC amplifier. Conversely, mixer 1 and mixer 3 are best chosen to be threshold or switching type mixers so as to minimize the effect of any LO amplitude changes (this causes correlator gain changes). Additionally, mixer 1 should provide good rejection of the LO signal in order to minimize any strong coupling of LO directly into the AC amplifier (this would result in a DC offset error in the correlator output).

Finally, when the circuit is constructed, care should be exercised to prevent LO leakage through all possible paths (power buses, stray coupling, imbalanced mixers, etc.) into the AC amplifier.

What is claimed is:

1. A low offset AC correlator having first and second input signals to be correlated comprising first, second, and third mixers, said first and second mixers operating as multipliers and said third mixer as a demodulator, a local oscillator providing a reference signal at a preselected frequency, a $\pi/2$ phase shifter for said second input signal, said second mixer receiving simultaneously said reference signal and the $\pi/2$ phase shifted second input signal to provide therefrom a resultant signal being a correlation product of a modulated carrier type, a first bandpass filter interconnecting said second and first mixers for transferring said resultant signal, said first bandpass filter having a preselected bandwidth at a preselected center frequency, said first mixer also receiving said first input signal to provide therefrom an output signal, a high gain AC amplifier, a second bandpass filter of a preselected bandwidth at a preselected center frequency transferring said output signal to said high gain AC amplifier to provide an AC amplified signal, said third mixer receiving simultaneously said AC amplified signal and said reference signal to synchronously demodulate to a DC level the AC amplified signal for a DC output, and a low pass filter receiving the DC output for filtering thereof.

* * * * *